US006333248B1

United States Patent
Kishimoto (10) Patent No.: US 6,333,248 B1
(45) Date of Patent: Dec. 25, 2001

(54) METHOD OF FABRICATING A SEMICONDUCTOR DEVICE

(75) Inventor: Koji Kishimoto, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/708,419

(22) Filed: Nov. 9, 2000

(30) Foreign Application Priority Data

Nov. 11, 1999 (JP) .................................... 11-320934

(51) Int. Cl.[7] .................... H01L 21/3205; H01L 21/4763
(52) U.S. Cl. ............................. 438/586; 438/687
(58) Field of Search ..................... 438/586, 626, 438/627, 629, 637, 643, 648, 656, 687, 667, 680, 683, 745, 959

(56) References Cited

U.S. PATENT DOCUMENTS

| 4,651,324 | * | 3/1987 | Prein et al. | 372/59 |
|---|---|---|---|---|
| 5,447,599 | * | 9/1995 | Li et al. | 216/17 |
| 5,447,887 | * | 9/1995 | Filipiak et al. | 438/687 |
| 5,470,789 | * | 11/1995 | Misawa | 438/643 |
| 5,510,651 | * | 4/1996 | Maniar et al. | 257/751 |
| 5,592,024 | * | 1/1997 | Aoyama et al. | 257/751 |
| 5,744,376 | * | 4/1998 | Chan et al. | 438/643 |

FOREIGN PATENT DOCUMENTS

| 4-192527 | 7/1992 | (JP) . |
|---|---|---|
| 5-218035 | 8/1993 | (JP) . |
| 11-111842 | 4/1999 | (JP) . |

* cited by examiner

Primary Examiner—David Nelms
Assistant Examiner—David Nhu
(74) Attorney, Agent, or Firm—McGinn & Gibb, PLLC (57) ABSTRACT

A method of fabricating a semiconductor device, includes the steps of (a) forming a first insulating film on a semiconductor substrate, (b) forming at least one recess at a surface of the first insulating film, (c) forming a first barrier layer covering a surface of the first insulating film and an inner surface of the recess therewith, (d) forming a copper layer over the first barrier layer such that the recess is entirely filled with the copper layer, (e) polishing the copper layer and the first barrier layer until the first insulating film appears, (f) exposing the copper layer to a plasma including at least one of carbon and hydrogen, (g) forming a second barrier layer on both the copper layer and the first insulating film, and (h) forming a second insulating film on the second barrier layer.

19 Claims, 4 Drawing Sheets

METHOD OF FABRICATING A SEMICONDUCTOR DEVICE

BACKGROUND OF THE INVENTION

1. Field of the Invention

The invention relates to a method of fabricating a semiconductor device, and more particularly to such a method including the step of reducing a copper oxide formed on a copper wiring layer.

2. Description of the Related Art

As a semiconductor device has been fabricated in a smaller size and in higher integration, a copper wiring layer has been used in place of an aluminum wiring layer in order to enhance a resistance of a metal wiring layer to electro-migration.

Since copper does not make a halogen compound having a high vapor pressure, it was quite difficult or almost impossible to form a copper wiring layer by dry etching. It has recently become possible to form a copper wiring layer by means of a damascene structure where copper is polished by chemical mechanical polishing (CMP).

However, copper has shortcomings that it is likely to be oxidized at a relatively low temperature, and that it is likely to spread in an insulating film such as a silicon dioxide film.

In order to overcome those shortcomings, U.S. Pat. No. 5,744,376 has suggested a method of fabricating a semiconductor device in which a copper wiring layer is surrounded by two different barrier layers.

In the suggested method, a first barrier layer composed of tantalum or tantalum nitride is formed between a copper wiring layer and a first insulating film formed just below the copper wiring layer. Then, extra copper and the first barrier layer are removed by CMP. Then, a second barrier layer composed of silicon nitride is formed on both the copper wiring layer and the first insulating film. Thereafter, a second insulating film composed of silicon dioxide is formed on the second barrier layer. In this method, the silicon nitride film or the second barrier layer is used as a cap film for preventing the copper wiring layer from being oxidized.

The suggested method is characterized in that a lower layer, that is, the first barrier layer is an electrically conductive film, whereas an upper layer, that is, the second barrier layer is an insulating film.

In this method, the first barrier layer prevents copper from spreading into the underlying insulating film, and the second barrier layer prevents copper from being oxidized when a via-hole is formed.

The via-hole is formed by dry etching to reach the second barrier layer. Then, a resist is removed by oxygen ashing.

Then, the second barrier layer is etched with the second insulating film being used as a mask until the copper wiring layer appears. The second barrier layer prevents the copper wiring layer from being directly exposed to oxygen plasma during oxygen ashing, ensuring that the copper wiring layer is not oxidized.

U.S. Pat. No. 5,447,887 has suggested a method of fabricating a semiconductor device, including the step of forming an intermediate layer composed of copper silicide in order to enhance adhesion between a copper wiring layer and a silicon nitride film formed on the copper wiring layer.

Since a silicon nitride film formed by plasma-enhanced CVD has poor adhesion with copper, when an insulating film is formed on a silicon nitride film, the silicon nitride film often peels off a copper wiring layer.

In order to solve this problem, a copper silicide ($Cu_3Si$) layer having a thickness of about 10 to 100 angstroms is formed on the copper wiring layer before forming the silicon nitride film. The copper silicide layer enhances adhesion between the copper wiring layer and the silicon nitride film.

The above-mentioned methods have problems as follows.

The first problem is that, in U.S. Pat. No. 5,744,376, since a copper oxide (CuxO) exists between the copper wiring layer and the silicon nitride film, the silicon nitride film is likely to peel off the copper wiring layer. In particular, the silicon nitride film is likely to peel off a copper wiring layer having a large area.

In addition, copper atoms can readily move at an interface because of poor adhesion, electro-migration is deteriorated.

This is because a copper oxide (CuxO) is produced at a surface of the copper wiring layer at the step of CMP or cleaning, or by leaving the copper wiring layer in atmosphere. A thicker copper oxide film is formed when the copper wiring layer is left in atmosphere for a longer period of time.

This is also because that the silicon nitride film cannot remove a copper oxide before it grows up.

The above-mentioned first problem remains unsolved in U.S. Pat. No. 5,447,887.

This is because if a copper oxide exists at a surface of the copper wiring layer, copper silicide cannot be sufficiently formed in silicidation.

Even if copper silicide is formed, oxygen existing in the form of a copper oxide decomposes copper silicide into silicon dioxide and copper, when a subsequent heat treatment is carried out. As a result, the copper silicide layer would have a reduced thickness relative to an original thickness, and hence, adhesion is deteriorated.

The second problem is that it is not possible to have a sufficiently low via-hole resistance.

This is because that a copper oxide exists on a copper wiring layer, and that a copper oxide is produced at a bottom of a via-hole, that is, on a surface of a copper wiring layer when the via-hole is formed.

In U.S. Pat. No. 5,744,376, since the silicon nitride film is etched with the second insulating film composed of silicon dioxide, oxygen is separated from etching species, and the thus separated oxygen oxidizes copper.

In addition, a copper oxide is formed at a bottom of a via-hole, when the copper layer is left in atmosphere. Existence of the copper oxide at an interface raises a via-hole resistance.

Physical sputtering such as argon sputtering etching may be carried out for removing the above-mentioned copper oxide. However, the physical sputtering would exert harmful influence on reliability of a device. This is the third problem.

The reason is as follows. Since copper atoms are also sputtered in physical sputtering, copper atoms are scattered to an insulating film at the stage before the silicon nitride film is formed, and scattered to a sidewall of a via-hole when a copper oxide formed at a bottom of a via-hole is removed. As a result, copper spreads in the insulating film composed of silicon dioxide. Such spread of copper exerts a harmful influence on reliability of a device.

In addition, it would be quite difficult or almost impossible to remove a copper oxide formed at a bottom of a via-hole by conventional sputtering etching, if a via-hole and a contact hole had a high aspect ratio.

Japanese Unexamined Patent Publication No. 4-192527 has suggested a semiconductor device including a layer composed of copper alloy between a copper wiring layer and a protection insulating layer.

Japanese Unexamined Patent Publication No. 5-218035 has suggested a method of fabricating a semiconductor device, including the step of forming a $RuO_2$ film as a barrier metal for a copper wiring layer, below the copper wiring layer by sputtering or CVD.

Japanese Unexamined Patent Publication No. 11-111842 has suggested a multi-layered structure including a lower wiring layer composed mainly of copper, and a plug composed of aluminum. The lower wiring layer is comprised of a lower barrier film, a copper film, an upper barrier film, and a electrically conductive adhesive thin layer.

However, the above-mentioned problems remain unsolved even in those Publications.

SUMMARY OF THE INVENTION

In view of the above-mentioned problems in the prior art, it is an object of the present invention to provide a method of fabricating a semiconductor device which method is capable of removing a copper oxide from an exposed surface of a copper wiring layer.

There is provided a method of fabricating a semiconductor device, including the steps of (a) forming a copper wiring layer on a barrier layer formed on an insulating film which is further formed on a semiconductor substrate, and (b) exposing the copper wiring layer to a plasma including at least one of carbon and hydrogen, to reduce a copper oxide formed on the copper wiring layer for converting the copper oxide into copper.

For instance, the plasma is a $CH_4$/He plasma derived from methane gas diluted with helium gas. As an alternative, the plasma may be a $CH_4$ plasma derived from methane gas.

It is preferable to heat the semiconductor substrate up to a temperature in the range of 300 to 650 degrees centigrade both inclusive, in the step (b).

For instance, the plasma is generated by applying a bias radio-frequency to the semiconductor substrate.

There is further provided a method of fabricating a semiconductor device, including the steps of (a) forming a first insulating film on a semiconductor substrate, (b) forming at least one recess at a surface of the first insulating film, (c) forming a first barrier layer covering a surface of the first insulating film and an inner surface of the recess therewith, (d) forming a copper layer over the first barrier layer such that the recess is entirely filled with the copper layer, (e) polishing the copper layer and the first barrier layer until the first insulating film appears, (f) exposing the copper layer to a plasma including at least one of carbon and hydrogen, (g) forming a second barrier layer on both the copper layer and the first insulating film, and (h) forming a second insulating film on the second barrier layer.

It is preferable that the plasma includes helium.

It is preferable that the method further includes the step (j) of heating the copper layer, the step (j) being to be carried out between the steps (d) and (e).

It is preferable that the resultant resulted from the step (f) is transferred into another chamber with the resultant being kept in vacuum, and then, the second barrier layer is formed in the another chamber in the step (g).

There is still further provided a method of fabricating a semiconductor device, including the steps of (a) forming a first insulating film on a semiconductor substrate, (b) forming at least one recess at a surface of the first insulating film, (c) forming a first barrier layer covering a surface of the first insulating film and an inner surface of the recess therewith, (d) forming a copper damascene layer in the recess, (e) forming a second barrier layer on both the copper damascene layer and the first insulating film, and (f) forming a second insulating film on the second barrier layer, (g) forming a via-hole throughout both the second barrier layer and the second insulating film such that the via-hole reaches the copper damascene layer, (h) exposing a surface of the copper damascene layer to a plasma through the via-hole, the plasma including at least one of carbon and hydrogen, and (i) forming an electrically conductive layer in the via hole.

Figure 2:
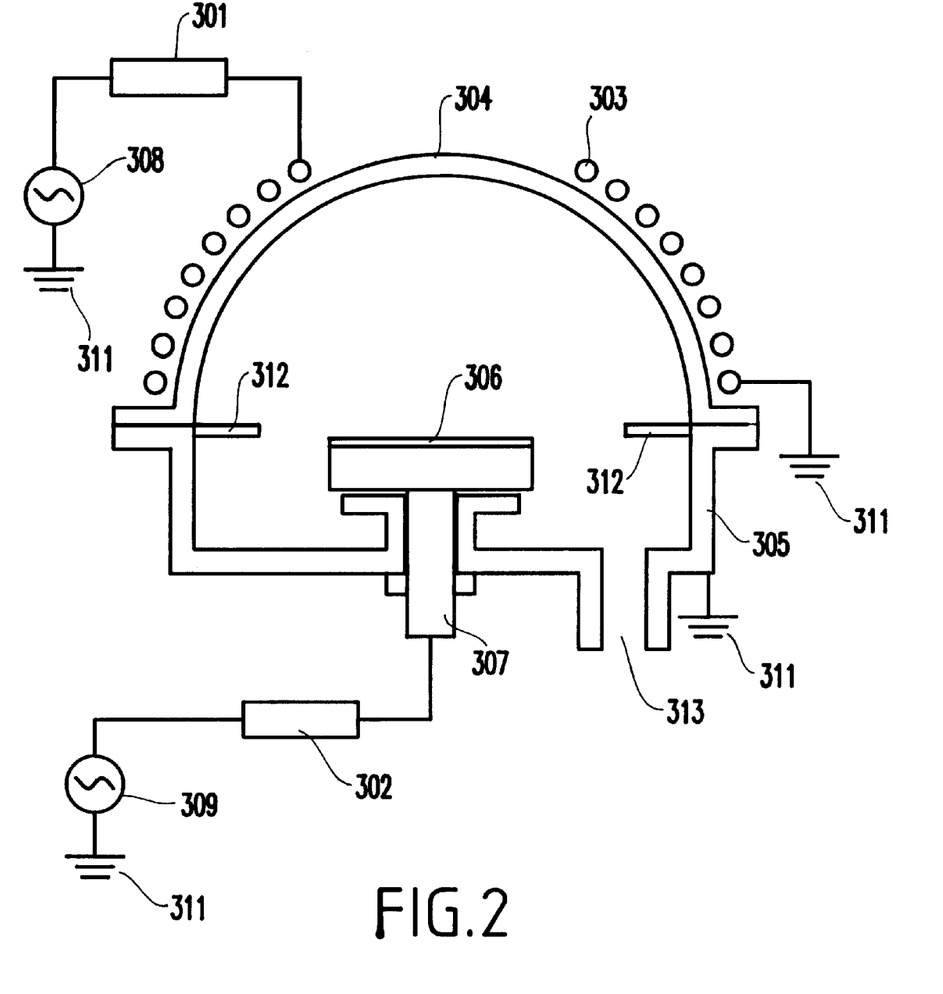
FIG. 2 is a cross-sectional view of an inductive coupling type apparatus for generating plasma, to be used in the method in accordance with the present invention.

FIG. 2 illustrates an inductive coupling type plasma generating apparatus to be used for carrying out the method in accordance with the present invention.

The illustrated plasma generating apparatus is comprised of a bell jar 304 composed of alumina ($Al_2O_3$), an inductive coil 303 wound around the bell jar 304, a first high-frequency power source 308 applying high-frequency power to the inductive coil 303, a pedestal 307 for absorbing a substrate 306 thereon, a second high-frequency power source 309 applying power having a frequency of 13.56 MHz, to the pedestal 307.

Receiving high-frequency power from the first high-frequency power source 308, the inductive coil 303 generates plasma in a chamber 305.

The first high-frequency power source 308 operates at a frequency of about 2.0 MHz. The first high-frequency power source 308 is grounded at 311, and is electrically connected to a first automatic matching box 301 which matches plasma and power applied from the first high-frequency power source 308, to each other.

The pedestal 307 includes a heater and a cooler for controlling a temperature of the substrate 306.

The second high-frequency power source 309 is grounded at 311, and is electrically connected to a second automatic matching box 302.

The bell jar 304 has gas inlets 312 and a gas outlet 313. The substrate 306 has a diameter of about 20 centimeters (about 8 inches).

The inventor conducted the experiments by means of the plasma generating apparatus illustrated in FIG. 2 for verifying removal of a copper oxide from a copper wiring layer.

First, a source power of about 300 W was applied to the first high-frequency power source 308, and a bias power of about 10 W was applied to the second high-frequency power source 309. At the same time, methane gas ($CH_4$) diluted with helium (He) gas was introduced into the chamber 305 through the gas inlets 312. As a result, $CH_4$/He plasma was generated in the chamber 305.

By exposing an about 40 nm-thick copper oxide (CuxO) layer formed on a copper wiring layer, to the 3% $CH_4$/He plasma under a pressure of about 10.67 Pa (about 80 mTorr) for about 90 seconds, the copper oxide layer was reduced, and accordingly, eliminated from a surface of the copper wiring layer.

Herein, the copper oxide layer was formed by the steps of forming a copper layer by electrolytic plating, polishing the copper layer by CMP, exposing a silicon nitride film to plasma etching chemistry, and leaving the copper wiring layer in atmosphere.

Existence or absence of oxygen was inspected by measuring a concentration profile of oxygen in a depth-wise direction by SIMS. In order to prevent oxidation of copper in atmosphere, existence or absence of oxygen was inspected after a copper cap layer having a thickness of about 30 nm had been formed by sputtering in another chamber without exposing the copper cap layer to atmosphere after exposing it to plasma.

The inductive coupling plasma (ICP) source produces carbon and hydrogen plasma having a high efficiency and a low ion energy. Since a copper oxide makes rapid chemical reaction with the carbon/hydrogen plasma, the copper oxide is reduced to a metal copper. Though hydrogen acts as a reducer, carbon acts as a more powerful reducer than hydrogen. Hence, the chemical reaction is likely to be made with respect to energy.

That is, the reactions defined by the following equations are made, and resultingly, a copper oxide is reduced to copper.

$$Cu_xO + C = Cu + CO(gas\ phase)$$

$$Cu_xO + 2H = Cu + H_2O(gas\ phase)$$

Contamination level at the time when a copper wiring layer was exposed to a plasma was inspected by putting a piece of clean silicon inside the bell jar 304. The contamination level was about $2 \times 10^{11}$ atoms?$cm^2$ under the following conditions:

Source Power: about 300 W;

Bias Power: about 10 W;

Pressure: 10.67 Pa (80 mTorr); and

Time for exposure to plasma: 15 minutes.

The contamination level of about $2 \times 10^{11}$ atoms?$cm^2$ is almost equal to a background level.

However, as the pressure was decreased, the contamination level was increased. Specifically, the contamination level was about $1 \times 10^{15}$ atoms/$cm^2$ at 3.4 Pa (about 25 mTorr). This means that a higher pressure makes a lower contamination level.

Herein below is explained that the exposure to plasma in the present invention makes less physical sputtering than argon plasma sputtering.

A source power of about 300 W was applied to the first high-frequency power source 308, and a bias power of about 300 W was applied to the second high-frequency power source 309. If the bias power is low, copper oxide could not be removed by argon sputtering. Hence, the bias power was set at about 300 W.

Sputtering rates of various films were measured under a pressure of about 3.4 Pa (about 25 mTorr) in 3% $CH_4$/He plasma and 100% Ar plasma.

When 3% $CH_4$/He plasma was selected, a degree of physical sputtering in both copper and silicon dioxide films was lower by a couple of figures than the same obtained when 100% Ar plasma was selected.

That is, about 50 nm of copper and silicon dioxide films were removed by 100% Ar plasma sputtering in a minute, whereas about 0.5 nm or smaller of copper and silicon dioxide films were removed by 3% $CH_4$/He plasma sputtering in a minute. Namely, 3% $CH_4$/He plasma sputtering presents a degree of physical sputtering about two or more figures smaller than the same in 100% Ar plasma sputtering.

This is because since masses of hydrogen, helium and carbon are smaller than a mass of argon, physical sputtering in $CH_4$/He plasma sputtering is smaller than the same in 100% Ar plasma sputtering.

As mentioned so far, a low bias power of about 10 W and a high pressure of about 10.67 Pa (about 80 mTorr) facilitate rapid reduction of copper oxide, and accomplish small physical sputtering.

The above and other objects and advantageous features of the present invention will be made apparent from the following description made with reference to the accompanying drawings, in which like reference characters designate the same or similar parts throughout the drawings.

DESCRIPTION OF THE PREFERRED EMBODIMENTS

Preferred embodiments in accordance with the present invention will be explained herein below with reference to drawings.

First Embodiment

FIGS. 1A to 1F are cross-sectional views of a semiconductor device, illustrating respective steps of a method of fabricating the same, in accordance with the first embodiment.

Figure 1A:
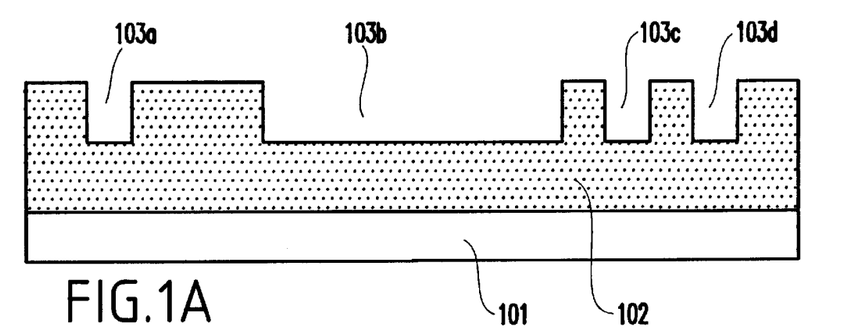
FIGS. 1A to 1F are cross-sectional views of a semiconductor device, illustrating respective steps of a method of fabricating the same, in accordance with the first embodiment of the present invention.

Though not illustrated, integrated circuits such as a semiconductor device and an underlying wiring are already fabricated on a silicon substrate 101.

First, as illustrated in FIG. 1A, a first insulating film 102 is formed on the silicon substrate 101 by the thickness of about 0.6 to about 3 micrometers by chemical vapor deposition (CVD) or spin coating. For instance, the first insulating film 102 is composed of a material having a low dielectric constant, such as silicon dioxide or amorphous carbon containing fluorine.

Then, recesses 103*a* to 103*d* are formed at a surface of the first insulating film 102 by photolithography and dry etching. Each of the recesses 103*a* to 103*d* has a depth of about 0.3 to about 1.5 micrometers. A thickness of the first insulating film 102 at a bottom of each of the recesses 103*a* to 103*d* is in the range of about 0.3 to about 1.5 micrometers.

Figure 1B:
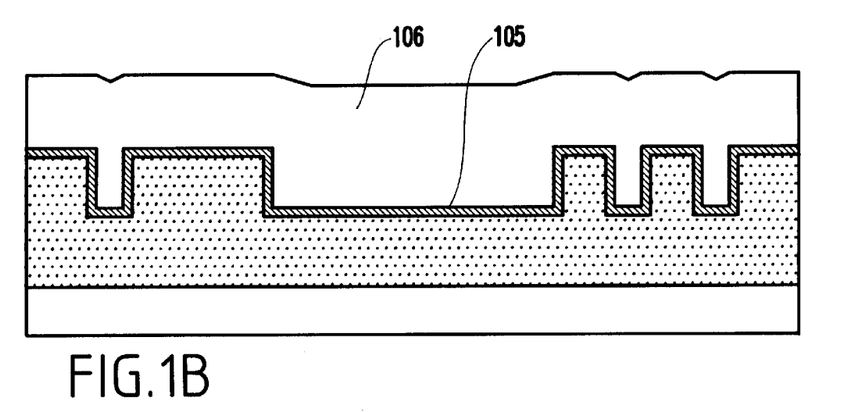

Then, as illustrated in FIG. 1B, a first barrier layer 105 is formed over the first insulating film 102 by the thickness of about 10 to about 50 nm such that the recesses 103*a* to 103*d* are entirely covered with the first barrier layer 105. The first barrier layer 105 is composed of titanium nitride, tantalum nitride or tantalum. As an alternative, the first barrier layer 105 may be designed to have a multi-layered structure including layers composed of titanium nitride, tantalum nitride or tantalum.

Then, as illustrated in FIG. 1B, a copper film 106 is formed over the first barrier layer 105 such that the recesses 103*a* to 103*d* are entirely filled with the copper film 106. The copper film 106 is formed by forming a thin copper film as a base layer by PVD (physical vapor deposition) or CVD, and applying electrolytic plating to the thin copper film to thicken the same.

Thereafter, the copper film 106 may be thermally annealed for densification. It is in particular preferably to thermally anneal the copper film 106 in a reducing atmosphere such as a hydrogen atmosphere, in order to enhance coverage property of the copper film 106.

Figure 1C:
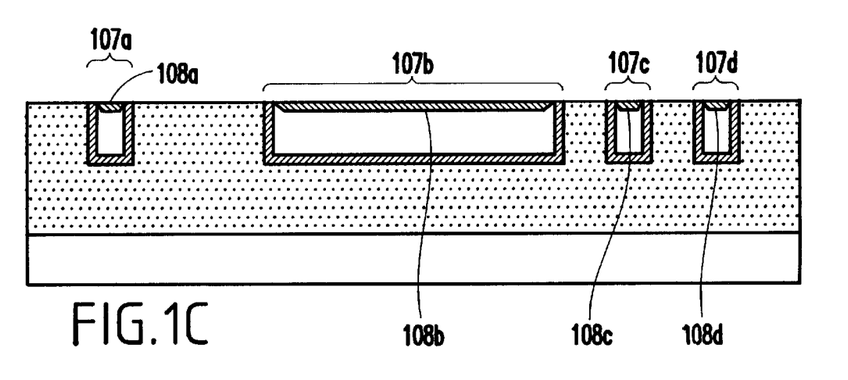

Then, as illustrated in FIG. 1(C), the copper film 106 and the first barrier layer 105 are polished by chemical mechanical polishing (CMP) until the first insulating film 102 appears, to thereby form damascene wiring layers 107a to 107d in the recesses 103a to 103d, respectively.

Then, the product is washed to remove dusts from a surface thereof.

Then, the product is stood in an atmosphere, resulting in that copper oxide layers 108a to 108d are formed at surfaces of the damascene wiring layers 107a to 107d, respectively. The thus formed copper oxide layers 108a to 108d have a thickness of about 3 to about 10 nm.

Figure 1D:
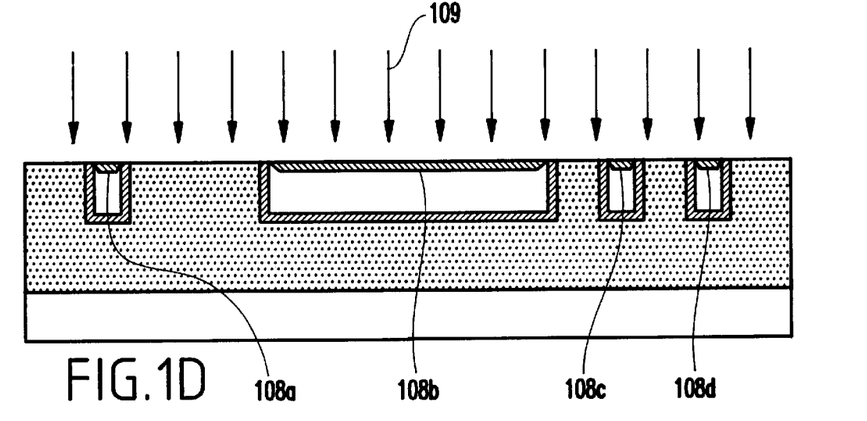

Then, as illustrated in FIG. 1D, plasma 109, generated by $CH_4$ and He gases through the use of the plasma-generating apparatus illustrated in FIG. 2, is applied to the damascene wiring layers 107a to 107d. As a result, the copper oxide layers 108a to 108d are reduced, and converted into metal copper layers.

The $CH_4$/He plasma was generated in the following conditions:

Gases: 3% $CH_4$ and He;
Pressure: about 10.67 Pa (about 80 mTorr);
Source Power: about 300 W; and
Bias Power: about 10 W.
The plasma is applied to the damascene wiring layers 107a to 107d for about 60 seconds.
Then, as illustrated in FIG. 1E, there is obtained the damascene wiring layers 107a to 107d having no copper oxide layers at a surface.

Figure 1E:
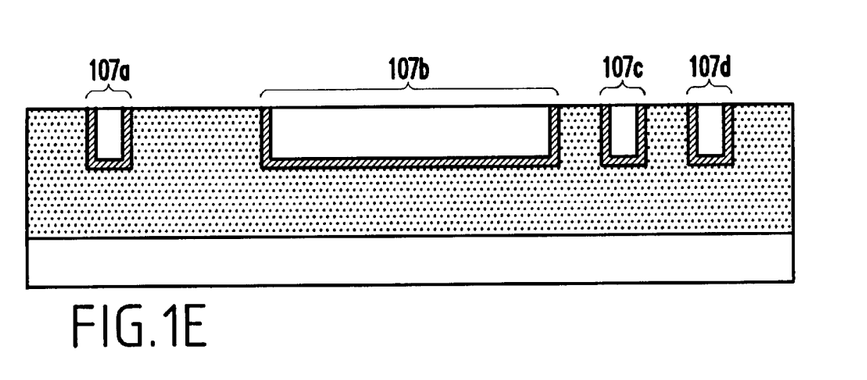

After removal of the copper oxide layers 108a to 108d, the product illustrated in FIG. 1E is transferred to another chamber with the product being kept in vacuum. Then, a second barrier film 110 is formed on the damascene wiring layers 107a to 107d and the first insulating film 102 by the thickness of about 20 to about 200 nm by plasma-enhanced CVD.

The second barrier film 110 is composed of a material by which copper is not oxidized and in which copper is not scattered. For instance, the second barrier film 110 is composed of silicon nitride or silicon carbide.

Figure 1F:
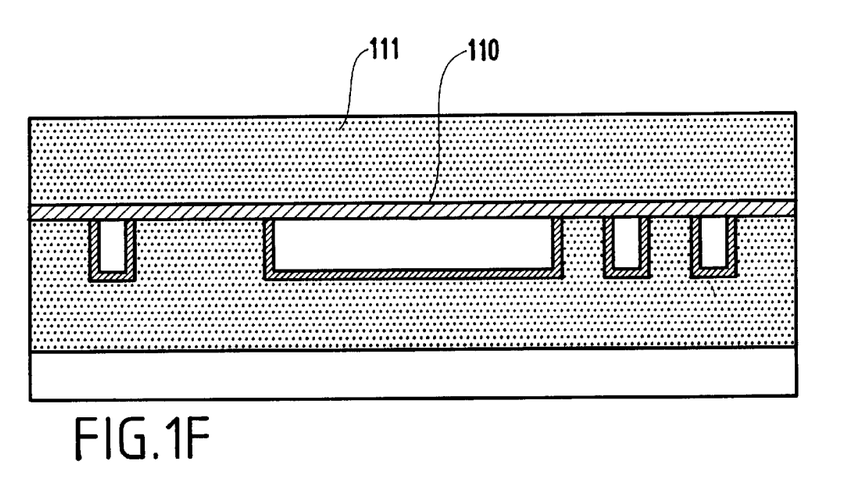

Then, as illustrated in FIG. 1F, a second insulating film 111 is formed on the second barrier layer 110 by the thickness of about 0.6 to about 3 micrometers by CVD or spin coating. The second insulating film 111 is composed of a material having a low dielectric constant, such as silicon dioxide or amorphous carbon containing fluorine.

If the copper oxide layers 108a to 108d are exposed to the plasma 109 with the silicon substrate 101 being kept at about 300 to 650 degrees centigrade, the copper oxide layers 108a to 108d could be more effectively removed. It should be noted that a maximum temperature for heating the silicon substrate 101 has to be lower than a temperature at which the first insulating film 102 is damaged.

Though $CH_4$ gas is diluted with He gas in the first embodiment, any other gases may be used for generating plasma, unless the gas contains carbon and hydrogen. Only $CH_4$ gas may be used.

Second Embodiment

Figure 3A:
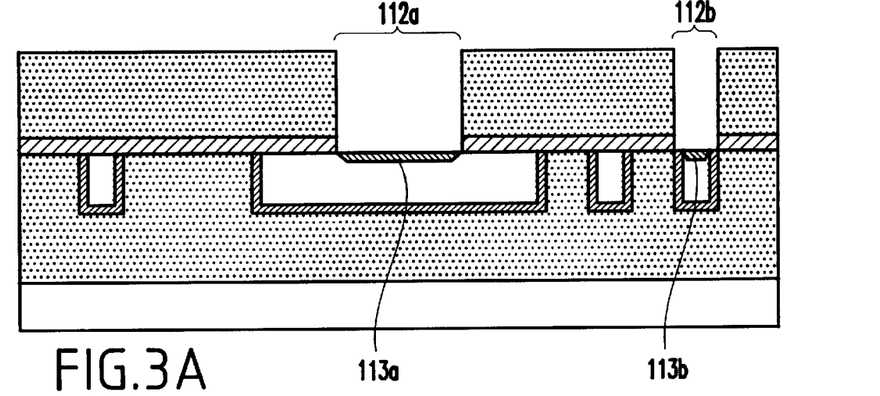
FIGS. 3A to 3C are cross-sectional views of a semiconductor device, illustrating respective steps of a method of fabricating the same, in accordance with the second embodiment of the present invention.
Figure 3B:
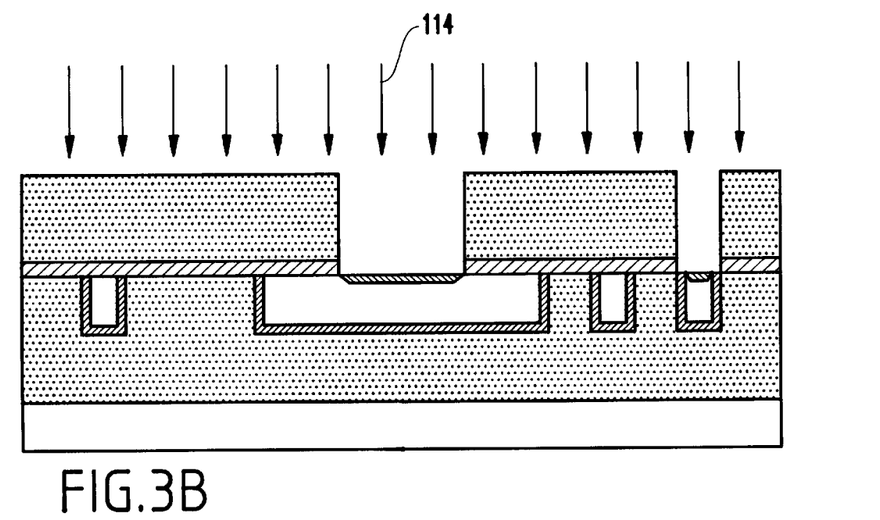
Figure 3C:
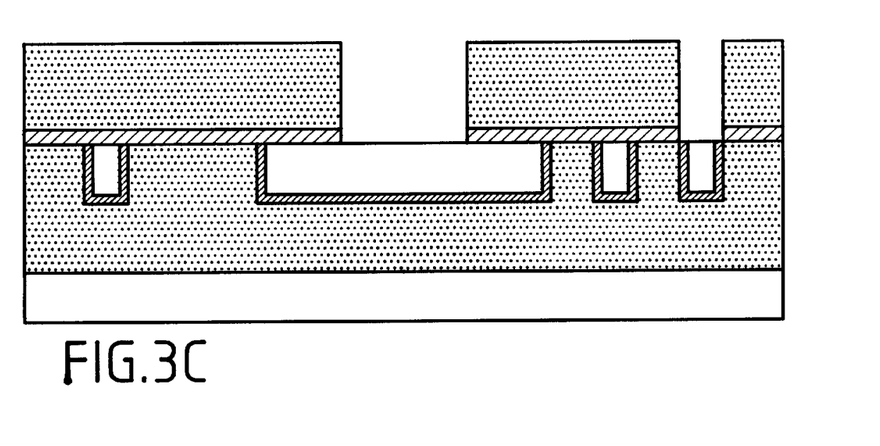

FIGS. 3A to 3C are cross-sectional views of a semiconductor device, illustrating respective steps of a method of fabricating the same, in accordance with the second embodiment.

The method in accordance with the second embodiment is carried out subsequently to the method in accordance with the first embodiment.

As illustrated in FIG. 3A, if via-holes 112a and 112b are formed throughout the second insulating film 111 and the second barrier layer 110 so that the via-holes 112a and 112b reach the damascene wiring layers 107b and 107d, respectively, as the damascene wiring layers 107b and 107d are exposed to an atmosphere, copper oxide layers 113a and 113b are formed at surfaces of the damascene wiring layers 107b and 107d.

Herein, if the second barrier layer is composed of silicon nitride and the second insulating film 111 is composed of silicon dioxide, the via-holes 112a and 112b are formed as follows.

First, via-holes are formed throughout the second insulating film 111 by photolithography and dry etching.

Then, a photoresist film (not illustrated) is removed by oxygen plasma ashing. At this stage, since the damascene wiring layers 107b and 107d are protected at surfaces thereof by the second barrier layer 110, copper is not oxidized at surfaces of the damascene wiring layers 107b and 107d.

Then, via-holes are formed throughout the second barrier layer 110 by dry plasma etching with the second insulating film 111 being used as a mask. Thus, there is obtained the structure as illustrated in FIG. 3A.

At this stage, if the second insulating film 111 contains oxygen, coppers are oxidized at surfaces of the damascene wiring layers 107b and 107d while the second insulating film 111 is being etched. As an alternative, if the product illustrated in FIG. 3A is exposed to an atmosphere, the copper oxide layers 113a and 113b are formed at surfaces of the damascene wiring layers 107b and 107d.

Then, as illustrated in FIG. 3B, plasma 114, generated by $CH_4$ and He gases through the use of the plasma-generating apparatus illustrated in FIG. 2, is applied to the damascene wiring layers 107b and 107d. As a result, the copper oxide layers 113a and 113b are reduced, and converted into metal copper layers.

After removal of the copper oxide layers 113a and 113b, the product illustrated in FIG. 3C is transferred to another chamber with the product being kept in vacuum. Then, a third barrier film (not illustrated) is formed on the second insulating film 111 and inner surfaces of the via-holes 112a and 112b. The third barrier layer is composed of titanium nitride, tantalum nitride or tantalum. As an alternative, the third barrier layer may be designed to have a multi-layered structure including layers composed of titanium nitride, tantalum nitride or tantalum.

Thereafter, the via-holes 112a and 112b are filled with metal such as tungsten and copper to thereby form plugs in the via-holes 112a and 112b. Then, an upper wiring layer is formed.

Due to reduction of copper oxide at an interface between the damascene wiring layers 107b and 107d and the third barrier layer, a via-hole resistance can be reduced by about 50% relative to conventional argon plasma sputtering in the case that the via-hole has a diameter of about 0.3 micrometers and an aspect ratio of about 2.0.

The advantages obtained by the aforementioned present invention will be described herein below.

The first advantage is that it is possible to prevent deterioration of a copper wiring layer due to peeling off or oxidation, by removing a copper oxide layer formed on a copper wiring layer and covering the copper wiring layer with a barrier layer. In particular, it is possible to prevent a copper wiring layer from peeling off an underlying layer in a large area.

This is because that hydrogen acts as a reducing agent, and carbon acts as a stronger reducing agent than hydrogen.

Coupling energy between molecules at least one of which consists of two atoms is as follows.

C—O: about 1074.6 KJ/mol=256.7 Kcal/mol
Si—O: about 803.7 KJ/mol=192 Kcal/mol
Cu—O: about 477 KJ/mol=114 Kcal/mol
H—O: about 427 KJ/mol=102.4 Kcal/mol Molecules having a great coupling energy stably exists on a surface of a layer being etched, whereas molecules having a small coupling energy unstably exists on the same. Accordingly, carbon absorbed to a surface of a copper oxide layer removes only oxygen from copper oxide, and turns into volatile CO molecule. Hence, carbon in the form of CO can be readily removed from a surface of a copper wiring layer.

In addition, since hydrogen also acts as a reducing agent, reduction caused by hydrogen is added to the reduction caused by carbon.

The second advantage is that it is possible to reduce a resistance of a via-hole by removing a copper oxide layer formed at a bottom of a via-hole. In particular, it would be possible to have a sufficiently low via-hole resistance even in a via-hole having a high aspect ratio.

This is because hydrogen and carbon existing in plasma scatter at a surface of a copper oxide layer, make rapid chemical reaction with copper oxide, and reduce copper oxide into metallic copper.

In addition, almost no physical sputtering is carried out in the present invention. This ensures that copper is not scattered to a sidewall of a via-hole, and that copper is prevented from scattering in an insulating film.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

The entire disclosure of Japanese Patent Application No. 11-320934 filed on Nov. 11, 1999 including specification, claims, drawings and summary is incorporated herein by reference in its entirety.

What is claimed is:

1. A method of fabricating a semiconductor device:
   (a) forming a copper wiring layer on a barrier layer formed on an insulating film which is further formed on a semiconductor substrate; and
   (b) exposing said copper wiring layer to a plasma including at least one of carbon and hydrogen, to reduce a copper oxide formed on said copper wiring layer for converting said copper oxide into copper.

2. The method as set forth in claim 1, wherein said plasma is a $CH_4$/He plasma derived from methane gas diluted with helium gas.

3. The method as set forth in claim 1, wherein said plasma is a $CH_4$ plasma derived from methane gas.

4. The method as set forth in claim 1, wherein said semiconductor substrate is heated up to a temperature in the range of 300 to 650 degrees centigrade both inclusive, in said step (b).

5. The method as set forth in claim 1, wherein said plasma is generated by applying a bias radio-frequency to said semiconductor substrate.

6. A method of fabricating a semiconductor device:
   (a) forming a first insulating film on a semiconductor substrate;
   (b) forming at least one recess at a surface of said first insulating film;
   (c) forming a first barrier layer covering a surface of said first insulating film and an inner surface of said recess therewith;
   (d) forming a copper layer over said first barrier layer such that said recess is entirely filled with said copper layer;
   (e) polishing said copper layer and said first barrier layer until said first insulating film appears;
   (f) exposing said copper layer to a plasma including at least one of carbon and hydrogen;
   (g) forming a second barrier layer on both said copper layer and said first insulating film; and
   (h) forming a second insulating film on said second barrier layer.

7. The method as set forth in claim 6, wherein said plasma includes helium.

8. The method as set forth in claim 6, wherein said plasma is a $CH_4$/He plasma derived from methane gas diluted with helium gas.

9. The method as set forth in claim 6, wherein said plasma is a $CH_4$ plasma derived from methane gas.

10. The method as set forth in claim 6, wherein said semiconductor substrate is heated up to a temperature in the range of 300 to 650 degrees centigrade both inclusive, in said step (f).

11. The method as set forth in claim 6, wherein said plasma is generated by applying a bias radio-frequency to said semiconductor substrate.

12. The method as set forth in claim 6, further comprising the step (j) of heating said copper layer, said step (j) being to be carried out between said steps (d) and (e).

13. The method as set forth in claim 6, wherein the resultant resulted from said step (f) is transferred into another chamber with said resultant being kept in vacuum, and then, said second barrier layer is formed in said another chamber in said step (g).

14. A method of fabricating a semiconductor device:
   (a) forming a first insulating film on a semiconductor substrate;
   (b) forming at least one recess at a surface of said first insulating film;
   (c) forming a first barrier layer covering a surface of said first insulating film and an inner surface of said recess therewith;
   (d) forming a copper damascene layer in said recess;
   (e) forming a second barrier layer on both said copper damascene layer and said first insulating film; and
   (f) forming a second insulating film on said second barrier layer;
   (g) forming a via-hole throughout both said second barrier layer and said second insulating film such that said via-hole reaches said copper damascene layer;
   (h) exposing a surface of said copper damascene layer to a plasma through said via-hole, said plasma including at least one of carbon and hydrogen; and
   (i) forming an electrically conductive layer in said via hole.

15. The method as set forth in claim 14, wherein said plasma includes helium.

16. The method as set forth in claim 14, wherein said plasma is generated by applying a bias radio-frequency to said semiconductor substrate.

17. The method as set forth in claim 5, wherein a bias power associated with said bias radio-frequency is set to approximately 300 W.

18. The method as set forth in claim 11, wherein a bias power associated with said bias radio-frequency is set to approximately 300 W.

19. The method as set forth in claim 16, wherein a bias power associated with said bias radio-frequency is set to approximately 300 W.

* * * * *